United States Patent
Lin et al.

(10) Patent No.: US 11,876,095 B2
(45) Date of Patent: *Jan. 16, 2024

(54) METHOD FOR ENLARGING TIP PORTION OF A FIN-SHAPED STRUCTURE

(71) Applicant: UNITED MICROELECTRONICS CORP., Hsin-Chu (TW)

(72) Inventors: Chun-Hao Lin, Kaohsiung (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 234 days.

This patent is subject to a terminal disclaimer.

(21) Appl. No.: 17/367,447

(22) Filed: Jul. 5, 2021

(65) Prior Publication Data

US 2021/0335786 A1 Oct. 28, 2021

Related U.S. Application Data

(60) Continuation of application No. 16/724,404, filed on Dec. 23, 2019, now Pat. No. 11,088,137, which is a
(Continued)

(30) Foreign Application Priority Data

Aug. 3, 2017 (CN) .......................... 201710655459.9

(51) Int. Cl.
*H01L 27/08* (2006.01)
*H01L 27/088* (2006.01)
(Continued)

(52) U.S. Cl.
CPC ........ *H01L 27/0886* (2013.01); *H01L 21/308* (2013.01); *H01L 21/31144* (2013.01); *H01L 21/76224* (2013.01); *H01L 21/823412* (2013.01); *H01L 21/823431* (2013.01); *H01L 21/823437* (2013.01); *H01L 21/823462* (2013.01); *H01L 21/823481* (2013.01); *H01L 27/0207* (2013.01); *H01L 29/0649* (2013.01);
(Continued)

(58) Field of Classification Search
None
See application file for complete search history.

(56) References Cited

U.S. PATENT DOCUMENTS 7,547,637 B2 6/2009 Brask
9,466,670 B2 10/2016 Hsiao et al.
(Continued)

FOREIGN PATENT DOCUMENTS

CN 103325736 A 9/2013
CN 104752218 A 7/2015
CN 105489494 A 4/2016

*Primary Examiner* — Bilkis Jahan
(74) *Attorney, Agent, or Firm* — Winston Hsu

(57) ABSTRACT

A method for fabricating semiconductor device includes the steps of: providing a substrate having a first region and a second region; forming a first fin-shaped structure on the first region and a second fin-shaped structure on the second region; forming a patterned mask on the second region; and performing a process to enlarge the first fin-shaped structure so that the top surfaces of the first fin-shaped structure and the second fin-shaped structure are different.

20 Claims, 3 Drawing Sheets

Related U.S. Application Data division of application No. 15/691,703, filed on Aug. 30, 2017, now Pat. No. 10,566,327.

(51) Int. Cl.
  H01L 21/8234 (2006.01)
  H01L 21/308 (2006.01)
  H01L 21/311 (2006.01)
  H01L 27/02 (2006.01)
  H01L 21/762 (2006.01)
  H01L 29/06 (2006.01)
  H01L 29/66 (2006.01)
  H01L 21/84 (2006.01)

(52) U.S. Cl.
  CPC .... *H01L 29/0657* (2013.01); *H01L 29/66545* (2013.01); *H01L 29/66818* (2013.01); *H01L 21/845* (2013.01)

(56) References Cited

U.S. PATENT DOCUMENTS

| | | |
|---|---|---|
| 9,741,623 B2 | 8/2017 | Sung |
| 2006/0284273 A1* | 12/2006 | Ho .................... H01L 27/14603 257/E27.131 |
| 2007/0114612 A1* | 5/2007 | Ahn ....................... H10B 10/12 438/585 |
| 2007/0290250 A1 | 12/2007 | Clark, Jr. et al. |
| 2008/0296702 A1* | 12/2008 | Lee ....................... H01L 27/088 257/E27.06 |
| 2008/0308848 A1* | 12/2008 | Inaba ................... H01L 27/1211 257/E27.099 |
| 2009/0261423 A1 | 10/2009 | Sawada |
| 2011/0278676 A1* | 11/2011 | Cheng ............. H01L 21/823807 438/585 |
| 2013/0270641 A1* | 10/2013 | Chi .................... H01L 29/66818 257/351 |
| 2016/0005735 A1 | 1/2016 | Costrini |
| 2017/0053835 A1 | 2/2017 | Sung |
| 2017/0221907 A1 | 8/2017 | Hsieh |
| 2017/0309623 A1 | 10/2017 | Pandey |
| 2018/0182859 A1 | 6/2018 | Lee |
| 2018/0277662 A1* | 9/2018 | Liang ................ H01L 29/66795 |
| 2018/0337188 A1* | 11/2018 | Yu ..................... H01L 21/76802 |
| 2018/0374851 A1* | 12/2018 | Wang ................... H01L 23/535 |

\* cited by examiner

METHOD FOR ENLARGING TIP PORTION OF A FIN-SHAPED STRUCTURE

CROSS REFERENCE TO RELATED APPLICATIONS

This is a continuation application of U.S. patent application Ser. No. 16/724,404, filed on Dec. 23, 2019, which is a division of U.S. patent application Ser. No. 15/691,703, filed on Aug. 30, 2017, all of which are hereby incorporated by reference in their entirety.

BACKGROUND OF THE INVENTION

1. Field of the Invention

The invention relates to a method for fabricating semiconductor device, and more particularly to a method of enlarging the tip portion of fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the importance of critical dimension (CD) of fin-shaped structure within a device has increased significantly. In current fabrication process for FinFET device, the fin-shaped structures disposed on the core region and the fin-shaped structures disposed on the input/output region preferably share same critical dimension. However, it has been noted that it would be more desirable for the devices on core region to have greater critical dimension for increasing the channel volume while it would be more advantageous for devices on input/out region to have smaller critical dimension for improving short channel effect and the current architecture clearly cannot satisfy the demand on both regions at the same time. Hence, how to effectively resolve this issue has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region and a second fin-shaped structure on the second region; forming a patterned mask on the second region; and performing a process to enlarge the first fin-shaped structure so that the top surfaces of the first fin-shaped structure and the second fin-shaped structure are different.

According to another aspect of the present invention, a semiconductor device includes a substrate having a first region and a second region and a first fin-shaped structure on the first region and a second fin-shaped structure on the second region. Preferably, a bottom surface of the first fin-shaped structure is equal to a bottom surface of the second fin-shaped structure and a top surface of the first fin-shaped structure is different from a top surface of the second fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
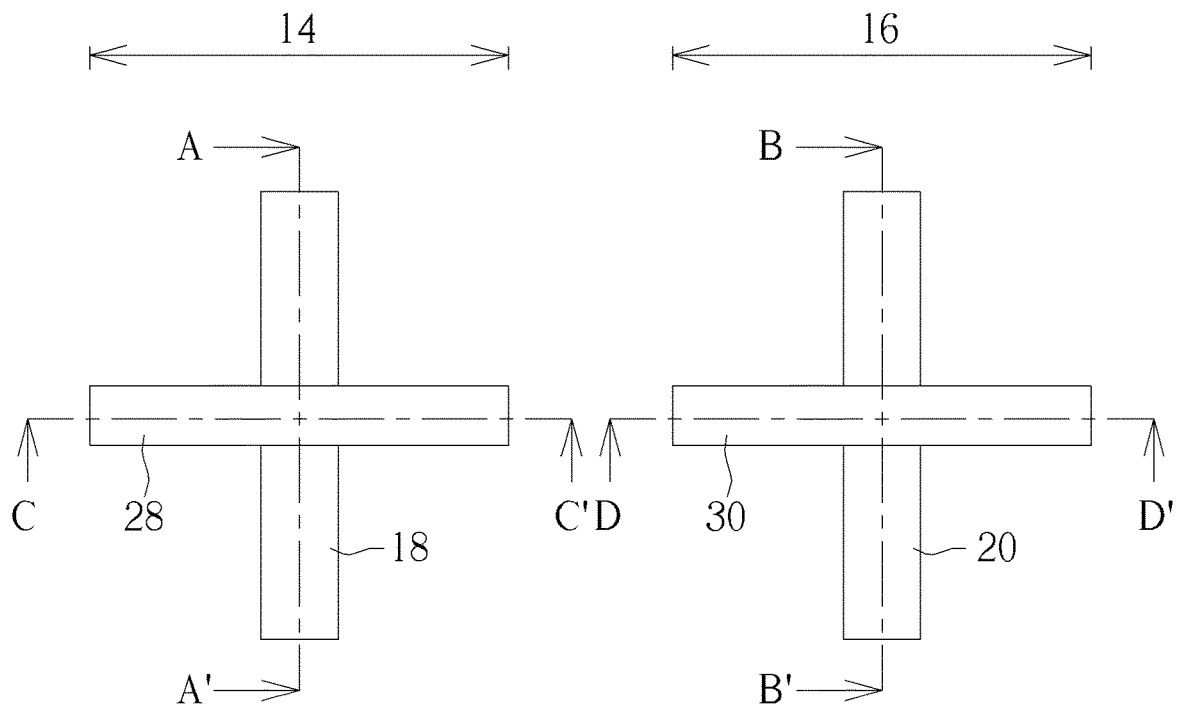
FIGS. 1-6 illustrate a method for fabricating semiconductor device according to an embodiment of the present invention.
Figure 2:
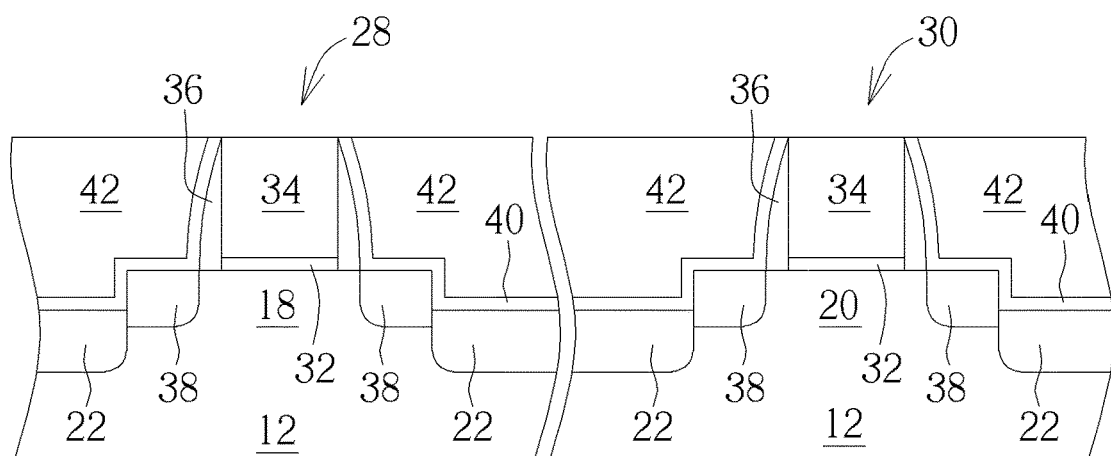
Figure 3:
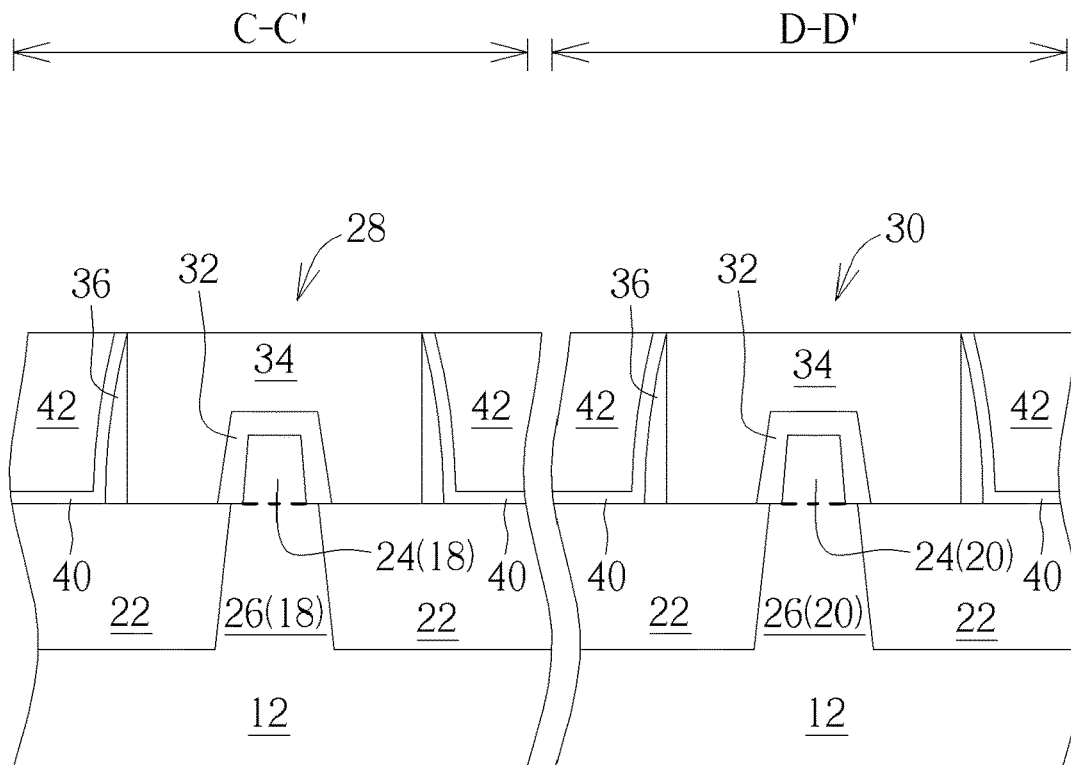

Referring to FIGS. 1-3, FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', the right portion of FIG. 2 illustrates a cross-sectional view of FIG. 1 for fabricating the semiconductor device along the sectional line BB', the left portion of FIG. 3 illustrates a cross-sectional view of FIG. 1 for fabricating the semiconductor device along the sectional line CC', and the right portion of FIG. 3 illustrates a cross-sectional view of FIG. 1 for fabricating the semiconductor device along the sectional line DD'. As shown in FIGS. 1-3, a substrate 12 such as a silicon substrate or silicon-on-insulator (SOI) substrate is first provided and a first region 14 and a second region 16 are defined on the substrate 12, in which the first region 14 preferably being a core region used to fabricate active devices in the later process while the second region 16 being an input/output region used to connect active devices with peripheral devices.

Next, fin-shaped structures are formed on the substrate 12 including forming first fin-shaped structures 18 on the first region 14 and second fin-shaped structures 20 on the second region 16, and a shallow trench isolation (STI) 22 is formed around the first fin-shaped structures 18 and second fin-shaped structures 20. In this embodiment, the formation of the STI 22 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an etching process are conducted to remove part of the silicon oxide layer so that the top surface of the remaining silicon oxide is slightly lower than the top surface of the fin-shaped structures 14 for forming the STI 22.

As shown in FIG. 3, it should be noted that part of the first fin-shaped structure 18 and part of the second fin-shaped structure 20 may be consumed to form into silicon oxide during the formation of the interfacial layer 32 thereby revealing different widths. For instance, a top portion 24 and a bottom portion 26 are preferably defined in each of the first fin-shaped structure 18 and second fin-shaped structure 20 after the interfacial layer 32 is formed. Preferably, the intersecting point between the top portion 24 and bottom portion 26 on first region 14 and second region 16 shown by the dotted line in FIG. 3 is even with the top surface of the STI 26, and the bottom surface of each top portion 24 on first region 14 and second region 16 is less than the top surface of each bottom portion 26 on first region 14 and second region 16 respectively.

Preferably, each of the fin-shaped structures of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate, 12, and through an etching process, the pattern of the patterned mask is transferred to the substrate 12 to form the fin-shaped structures. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures. These approaches for forming fin-shaped structure are all within the scope of the present invention.

Next, at least a gate structures or dummy gate including a first gate structure 28 and a second gate structure 30 are formed on each fin-shaped structure. In this embodiment, the formation of the first gate structure 28 and second gate structure 30 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a photo-etching process is then conducted by using a patterned resist (not shown) as mask to remove part of the gate material layer and part of the gate dielectric layer through single or multiple etching processes. After stripping the patterned resist, a first gate structure 28 and second gate structure 30 each composed of a patterned interfacial layer 32 and a patterned material layer 34 are formed on the first fin-shaped structure 18 and second fin-shaped structure 20 respectively.

Next, at least a spacer 36 is formed on the sidewalls of the each of the first gate structure 28 and second gate structure 30, a source/drain region 38 and/or epitaxial layer (not shown) is formed in the fin-shaped structure adjacent to two sides of each spacer 36, and selective silicide layers (not shown) could be formed on the surface of the source/drain regions 38. In this embodiment, the spacer 36 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 38 could include n-type dopants or p-type dopants depending on the type of device being fabricated.

Next, a contact etch stop layer (CESL) 40 is formed on the surface of the fin-shaped structures and covering the first gate structure 28 and the second gate structure 30, and an interlayer dielectric (ILD) layer 42 is formed on the CESL 40. Next, a planarizing process such as CMP is conducted to remove part of the ILD layer 42 and part of the CESL 40 for exposing the gate material layer 34 made of polysilicon, in which the top surface of the gate material layer 34 is even with the top surface of the ILD layer 42.

Next, a replacement metal gate (RMG) process is conducted to transform the first gate structure 18 and second gate structure 20 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 34 and even interfacial layer 32 of first gate structure 18 and second gate structure 20 for forming recesses 60 in the ILD layer 42.

Figure 4:
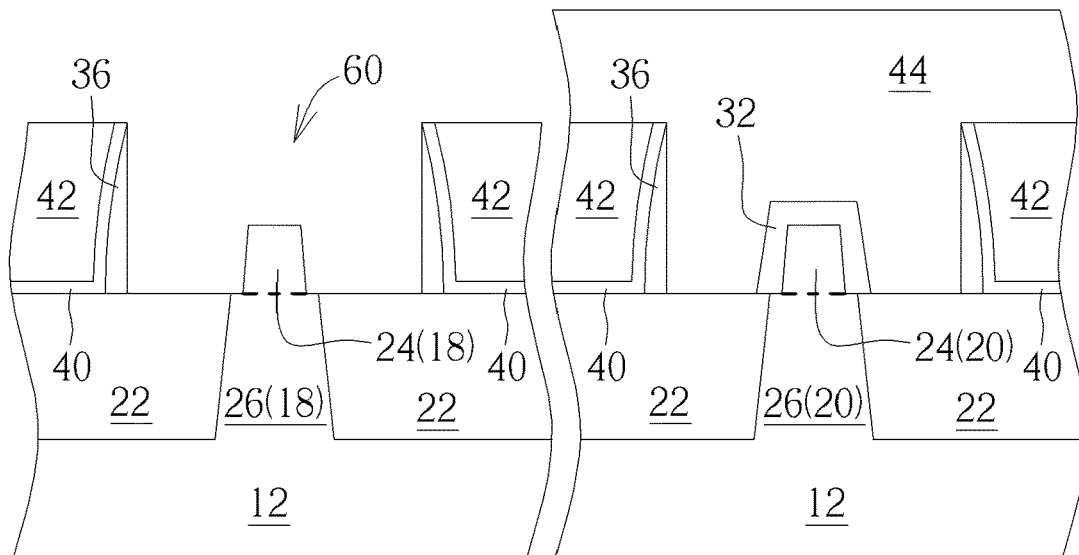
Figure 5:
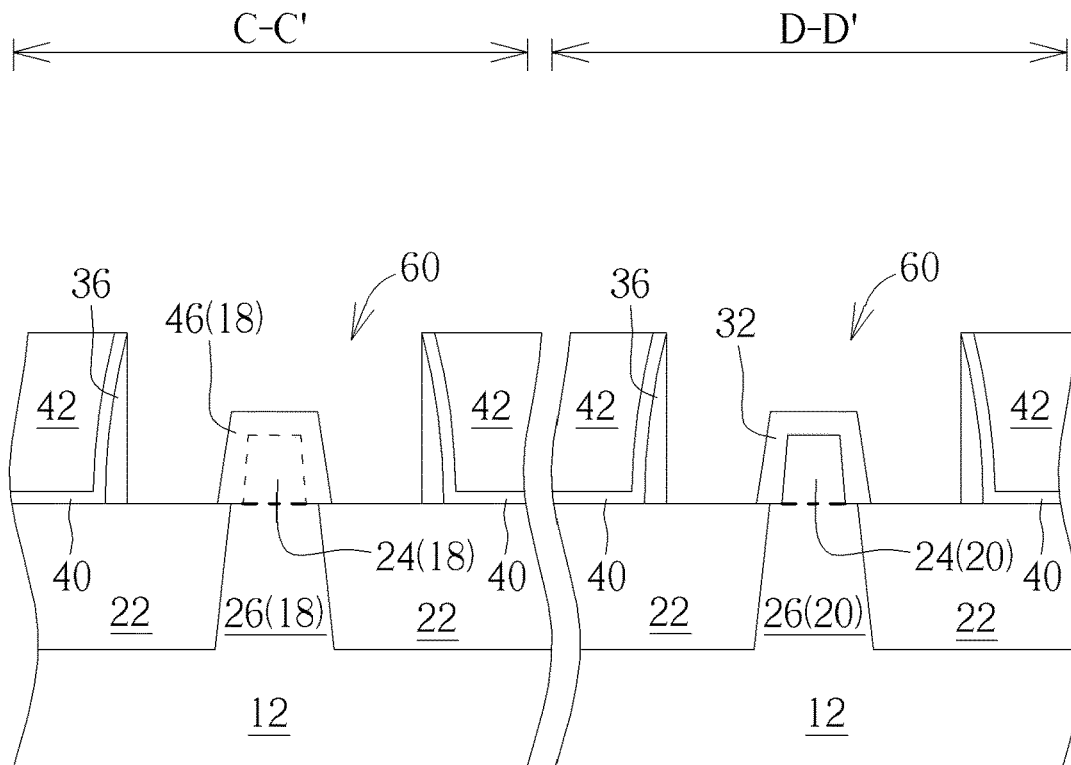
Figure 6:
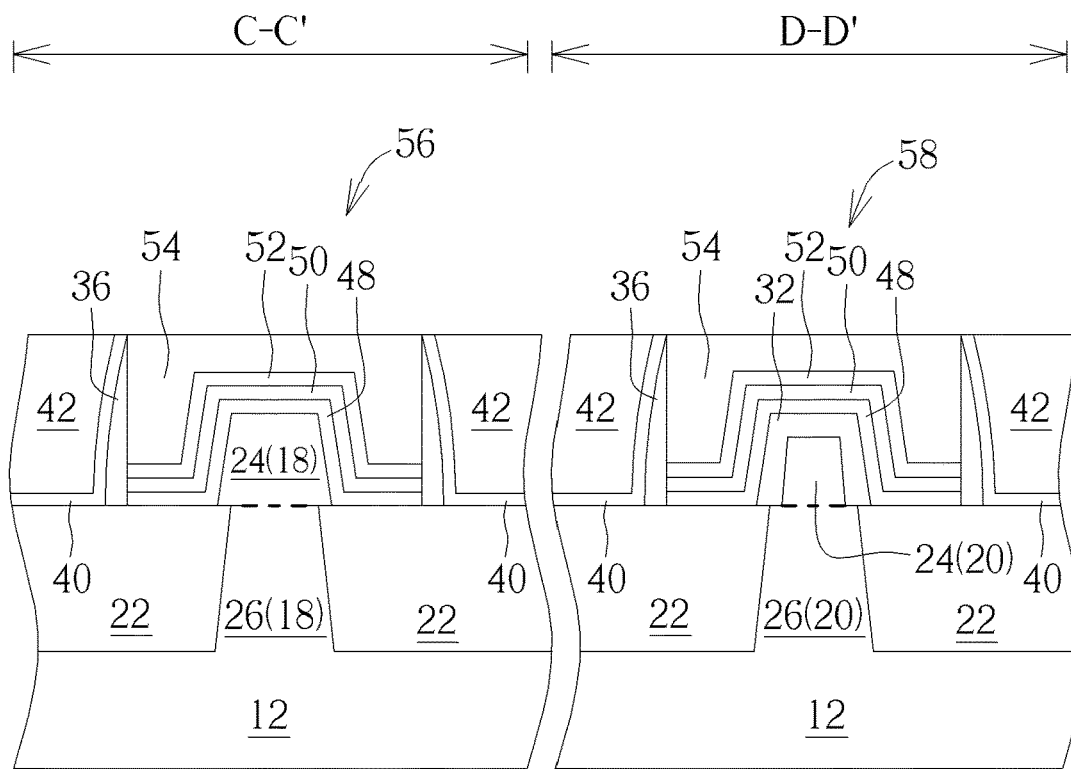

Referring to FIGS. 4-6, FIGS. 4-6 illustrate a method for fabricating semiconductor device following FIG. 3. As shown in FIG. 4, a patterned mask 44 is then formed on the second region 16 including covering the ILD layer 42 and first interfacial layer 32 on the second region 16 while exposing the first fin-shaped structure 18 and STI 22 on the first region 14. Next, an etching process is conducted by using the patterned mask 44 as mask to remove the interfacial layer 32 on the first region 14 and expose the top portion 24 of the fin-shaped structure 18.

Next, as shown in FIG. 5, the patterned mask 44 on the second region 16 is removed completely, and a treatment process is conducted without forming additional patterned mask to enlarge the tip portion of the first fin-shaped structure 18 so that the top surface of the top portion 24 of first fin-shaped structure 18 is different from the top surface of the top portion 24 of second fin-shaped structure 20. Specifically, the treatment process preferably includes performing an epitaxial growth process to form a semiconductor layer 46 on the first fin-shaped structure 18. Preferably, the semiconductor layer 46 and the first fin-shaped structure 18 are made of same material so that the semiconductor layer 46 and the original first fin-shaped structure 18 are merged together to form a new top portion 24. In this embodiment, the semiconductor layer 46 and the first fin-shaped structure 18 are preferably made of silicon. Nevertheless, according to an embodiment of the present invention, the semiconductor layer 46 and the first fin-shaped structure 18 could also be made of different material depending on the demand of the process while both the semiconductor layer 46 and first fin-shaped structure 18 could be selected from the group consisting of silicon, germanium (Ge), silicon germanium (SiGe), and silicon phosphide (SiP).

It should be noted that since the top portion 24 of the second fin-shaped structure 20 on the second region 16 is covered by the interfacial layer 32 before the aforementioned treatment process is conducted, the semiconductor layer 46 would only form on the top portion 24 of first fin-shaped structure 18 on first region 14 but not on the top portion 24 of second fin-shaped structure 20 on second region 16. In contrast to the original top portions 24 of first fin-shaped structure 18 and second fin-shaped structure 20 sharing same height and width as shown in FIG. 3, the new top portion 24 of first fin-shaped structure 18 and the new top portion 24 of second fin-shaped structure 20 shown in FIG. 5 preferably sharing different heights and widths.

Viewing from a more detailed perspective as shown in FIG. 6, the bottom surface of the new top portion 24 on the first region 14 is preferably greater than the top surface of bottom portion 26 on first region 14, the bottom surface of the top portion 24 on the second region 16 however is less than the top surface of the bottom portion 26 on the second region 16, both the top surface and bottom surface of the top portion 24 on the first region 14 are greater than both the top surface and bottom surface of the top portion 24 on the second region 16, and the top surface of the bottom portion 26 on the first region 14 is equal to the top surface of the bottom portion 26 on the second region 16. In other words, only the surface area of the channel region on first fin-shaped structure 18 covered and crossed by the gate structure on first region 14 is increased thereby having increased channel width while the surface area and channel width on the second fin-shaped structure 20 covered and crossed by the gate structure on second region 16 remains unchanged.

Next, as shown in FIG. 6, another interfacial layer 48 or gate dielectric layer (not shown) is formed on each of the first fin-shaped structure 18 and second fin-shaped structure 20, a high-k dielectric layer 50, a work function metal layer 52, and a low resistance metal layer 54 are formed in the recesses 60, and a planarizing process such as CMP is conducted to remove part of low resistance metal layer 54, part of work function metal layer 52, and part of high-k dielectric layer 50 to form a first metal gate 56 and second metal gate 58. In this embodiment, the first metal gate 56 preferably includes an interfacial layer 48 or gate dielectric layer, a U-shaped high-k dielectric layer 50, a U-shaped work function metal layer 52, and a low resistance metal layer 54 and the second metal gate 58 preferably includes an interfacial layer 32, another interfacial layer 48, a U-shaped high-k dielectric layer 50, a U-shaped work function metal layer 52, and a low resistance metal layer 54.

In this embodiment, the high-k dielectric layer 50 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 52 is formed for tuning the work function of the metal gate in accordance with the conductivity of the device. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 54 may include copper (Cu), aluminum (Al), titanium aluminum (TiAl), cobalt tungsten phosphide (CoWP) or any combination thereof.

Overall, the present invention first forms fin-shaped structures on the core region and input/output region on a semiconductor substrate, forms a patterned mask to cover the input/output region, and then performs a treatment process such as epitaxial growth process to form a semiconductor layer on the fin-shaped structure on core region to increase the overall critical dimension of fin-shaped structure on the core region thereby increasing channel width. Since the fin-shaped structure on the input/output region is covered by the patterned mask during the formation of semiconductor layer, the critical dimension of the fin-shaped structure on input/output region remains unchanged as the critical dimension of the fin-shaped structure on core region is enlarged.

Typically, it would be desirable for the devices on core region to have greater critical dimension to increase channel volume while it would be advantageous for devices on input/out region to have smaller critical dimension for improving short channel effect. By following the aforementioned approach for fabricating a semiconductor device the present invention is able to maintain the critical dimension of fin-shaped structure on input/output region while increasing the critical dimension of fin-shaped structure on the core region thereby satisfying the demands on both regions at the same time as well as boosting the overall performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a first fin-shaped structure on the first region and a second fin-shaped structure on the second region;
   forming a patterned mask on the second region after forming a first gate structure on the first fin-shaped structure and a second gate structure on the second fin-shaped structure;
   performing a process to enlarge the first fin-shaped structure so that the top surfaces of the first fin-shaped structure and the second fin-shaped structure are different; and
   transforming the first gate structure and the second gate structure into a first metal gate and a second metal gate.

2. The method of claim 1, further comprising:
   forming a first interfacial layer on the first fin-shaped structure and the second fin-shaped structure;
   forming the patterned mask on the first interfacial layer on the second region;
   removing the first interfacial layer on the first region;
   removing the patterned mask on the second region; and
   forming a second interfacial layer on the first fin-shaped structure and the second fin-shaped structure.

3. The method of claim 1, further comprising:
   forming an interlayer dielectric (ILD) layer around the first gate structure and the second gate structure;
   removing the first gate structure and the second gate structure to form a first recess and a second recess; and forming the patterned mask on the first interfacial layer on the second region after forming the first recess and the second recess.

4. The method of claim 1, wherein each of the first fin-shaped structure and the second fin-shaped structure comprises a top portion and a bottom portion, the method comprising:
forming a shallow trench isolation (STI) around the bottom portions of the first fin-shaped structure and the second fin-shaped structure.

5. The method of claim 4, wherein a bottom surface of the top portion on the first region and a top surface of the bottom portion on the second region are even with a top surface of the STI.

6. The method of claim 4, wherein a bottom surface of the top portion on the first region is greater than a top surface of the bottom portion on the first region.

7. The method of claim 4, wherein a bottom surface of the top portion on the second region is less than a top surface of the bottom portion on the second region.

8. The method of claim 1, wherein a bottom surface of the first fin-shaped structure is equivalent to a bottom surface of the second fin-shaped structure.

9. The method of claim 1, wherein the process comprises performing an epitaxial growth process to form a semiconductor layer on the first fin-shaped structure.

10. The method of claim 9, wherein the semiconductor layer and the first fin-shaped structure comprise same material.

11. The method of claim 1, wherein the first metal gate comprises a work function metal layer.

12. The method of claim 11, wherein the work function metal layer comprises a work function ranging between 3.9 eV and 4.3 eV.

13. The method of claim 11, wherein the work function metal layer comprises titanium aluminide (TiAl), zirconium aluminide (ZrAl), tungsten aluminide (WAl), tantalum aluminide (TaAl), hafnium aluminide (HfAl), or titanium aluminum carbide (TiAlC).

14. The method of claim 11, wherein the work function metal layer comprises a work function ranging between 4.8 eV and 5.2 eV.

15. The method of claim 11, wherein the work function metal layer comprises titanium nitride (TiN), tantalum nitride (TaN), or tantalum carbide (TaC).

16. The method of claim 1, wherein the second metal gate comprises a work function metal layer.

17. The method of claim 16, wherein the work function metal layer comprises a work function ranging between 3.9 eV and 4.3 eV.

18. The method of claim 16, wherein the work function metal layer comprises titanium aluminide (TiAl), zirconium aluminide (ZrAl), tungsten aluminide (WAl), tantalum aluminide (TaAl), hafnium aluminide (HfAl), or titanium aluminum carbide (TiAlC).

19. The method of claim 16, wherein the work function metal layer comprises a work function ranging between 4.8 eV and 5.2 eV.

20. The method of claim 16, wherein the work function metal layer comprises titanium nitride (TiN), tantalum nitride (TaN), or tantalum carbide (TaC).

* * * * *